(12) United States Patent
Zhao et al.

(10) Patent No.: US 12,745,441 B2
(45) Date of Patent: Sep. 22, 2026

(54) SEMICONDUCTOR DEVICE AND METHOD FOR MANUFACTURING THE SAME

(71) Applicant: INNOSCIENCE (SUZHOU) TECHNOLOGY CO., LTD., Suzhou City (CN)

(72) Inventors: Qiyue Zhao, Suzhou City (CN); Yu Shi, Suzhou City (CN)

(73) Assignee: INNOSCIENCE (SUZHOU) TECHNOLOGY CO., LTD., Suzhou City (CN)

( * ) Notice: Subject to any disclaimer, the term of this patent is extended or adjusted under 35 U.S.C. 154(b) by 1303 days.

(21) Appl. No.: 17/623,264

(22) PCT Filed: Nov. 10, 2021

(86) PCT No.: PCT/CN2021/129677

§ 371 (c)(1),
(2) Date: Dec. 28, 2021

(87) PCT Pub. No.: WO2023/082071

PCT Pub. Date: May 19, 2023

(65) Prior Publication Data

US 2024/0038852 A1 Feb. 1, 2024

(51) Int. Cl.
*H10D 64/00* (2025.01)
*H10D 30/01* (2025.01)
(Continued)

(52) U.S. Cl.
CPC ......... *H10D 64/112* (2025.01); *H10D 30/015* (2025.01); *H10D 30/475* (2025.01); *H10D 62/8503* (2025.01)

(58) Field of Classification Search
CPC ........................... H10D 64/112; H10D 30/015
See application file for complete search history.

(56) References Cited

U.S. PATENT DOCUMENTS

2011/0057257 A1 3/2011 Park et al.
2022/0093747 A1* 3/2022 Ohno ................ H10D 62/8503
(Continued)

FOREIGN PATENT DOCUMENTS

CN 101238561 A * 8/2008 ........... H10D 64/112
CN 111682065 A 9/2020
(Continued)

OTHER PUBLICATIONS

International Search Report and Written Opinion of the corresponding PCT application No. PCT/CN2021/129677 mailed on Jun. 10, 2022.

*Primary Examiner* — Jeff W Natalini
*Assistant Examiner* — Jacob Raul Marin
(74) *Attorney, Agent, or Firm* — Li & Cai Intellectual Property (USA) Office

(57) ABSTRACT

A semiconductor device includes a first and a second nitride-based semiconductor layers, a first and a second electrodes, a first gate electrode, a first and a second field plates. The first field plate is disposed over the second nitride-based semiconductor layer and extends from a region between the first electrode and the first gate electrode to a region directly over the first gate electrode. The second field plate is disposed over the second nitride-based semiconductor layer and extends from a region between the first electrode and the first field plate to a region directly over the first field plate. The second field plate is horizontally spaced away from the first gate electrode.

19 Claims, 9 Drawing Sheets

(51) Int. Cl.
*H10D 30/47* (2025.01)
*H10D 62/85* (2025.01)

(56) References Cited

U.S. PATENT DOCUMENTS

| | | | | |
|---|---|---|---|---|
| 2022/0130965 | A1* | 4/2022 | Bothe | H10D 64/112 |
| 2022/0293745 | A1* | 9/2022 | Isobe | H10D 64/112 |
| 2022/0293779 | A1* | 9/2022 | Du | H10D 30/475 |
| 2023/0090106 | A1* | 3/2023 | Then | H10D 86/01<br>257/76 |
| 2023/0095367 | A1* | 3/2023 | Zhao | H10D 84/05<br>257/192 |
| 2023/0115802 | A1* | 4/2023 | Byun | H10K 59/131<br>257/40 |
| 2023/0124686 | A1* | 4/2023 | Renaud | H10D 30/015<br>257/76 |

FOREIGN PATENT DOCUMENTS

| | | | |
|---|---|---|---|
| CN | 112786685 | A | 5/2021 |
| CN | 112789731 | A | 5/2021 |
| CN | 113016074 | A | 6/2021 |
| CN | 113519064 | A | 10/2021 |

* cited by examiner 172
170
14
12
10

115
116
118
110
112
114
176
174
14

134
118
174
114
180
178
130
14

136
134
118
114
132
130
14

136
178
132
182

O3
118
O2
114
O1
124
122
120

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device with multiple overlapping field plates.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

In order to avoid breakdown phenomenon induced by a strong peak electrical field near a gate edge, field plates are adopted to modulate electrical field distribution therein. However, the configuration of the field plates may induce unwanted parasitic/stray capacitances which limits the maximum operating frequency of the device, thereby degrading the electrical properties and the reliability thereof. Therefore, there is a need to improve device performance.

SUMMARY OF THE DISCLOSURE

In accordance with one aspect of the present disclosure, a semiconductor device is provided. A semiconductor device includes a first nitride-based semiconductor layer, a second nitride-based semiconductor layer, a first electrode, a second electrode, a first gate electrode, a first field plate and a second field plate. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first electrode and the second electrode are disposed above the second nitride-based semiconductor layer. The first gate electrode is disposed above the second nitride-based semiconductor layer and between the first and second electrodes. The first field plate is disposed over the second nitride-based semiconductor layer and extends from a region between the first electrode and the first gate electrode to a region directly over the first gate electrode. The second field plate is disposed over the second nitride-based semiconductor layer and extends from a region between the first electrode and the first field plate to a region directly over the first field plate. The second field plate is horizontally spaced away from the first gate electrode.

In accordance with one aspect of the present disclosure, a semiconductor device is provided. A semiconductor device includes a first nitride-based semiconductor layer, a second nitride-based semiconductor layer, a first electrode, a second electrode, a gate electrode, a first field plate and a second field plate. The first nitride-based semiconductor layer is disposed above a substrate. The second nitride-based semiconductor layer is disposed on the first nitride-based semiconductor layer and has a bandgap greater than a bandgap of the first nitride-based semiconductor layer. The first electrode and the second electrode are disposed above the second nitride-based semiconductor layer. The gate electrode is disposed above the second nitride-based semiconductor layer and between the first and second electrodes. The first field plate is disposed over the second nitride-based semiconductor layer and extends from a region between the first electrode and the gate electrode to a region directly over the gate electrode. The second field plate is disposed over the second nitride-based semiconductor layer. The first field plate is located between the gate electrode and the second field plate. An entirety of the second field plate is located between the first electrode and the first field plate.

In accordance with one aspect of the present disclosure, a method for manufacturing a semiconductor device is provided. The method includes steps as follows. A first nitride-based semiconductor layer is formed over a substrate. A second nitride-based semiconductor layer is formed on the first nitride-based semiconductor layer. A gate electrode is formed over the second nitride-based semiconductor layer. A first field plate is formed over the second nitride-based semiconductor layer and extends to a region directly over the gate electrode. A second field plate is formed over the second nitride-based semiconductor layer and extends to a region directly over the first field plate such that the first field plate is located between the gate electrode and the second field plate.

By the above configuration, the semiconductor device at least includes two field plates for achieving a better electric field distribution. Two end portions of the first field plate vertically overlaps with the gate electrode and the second field plate, respectively. The second field plate is horizontally/laterally spaced away from the gate electrode instead of overlapping with the gate electrode. Such a configuration can alleviate the negative impact caused by parasitic capacitance; therefore, the semiconductor device can have good electrical properties.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
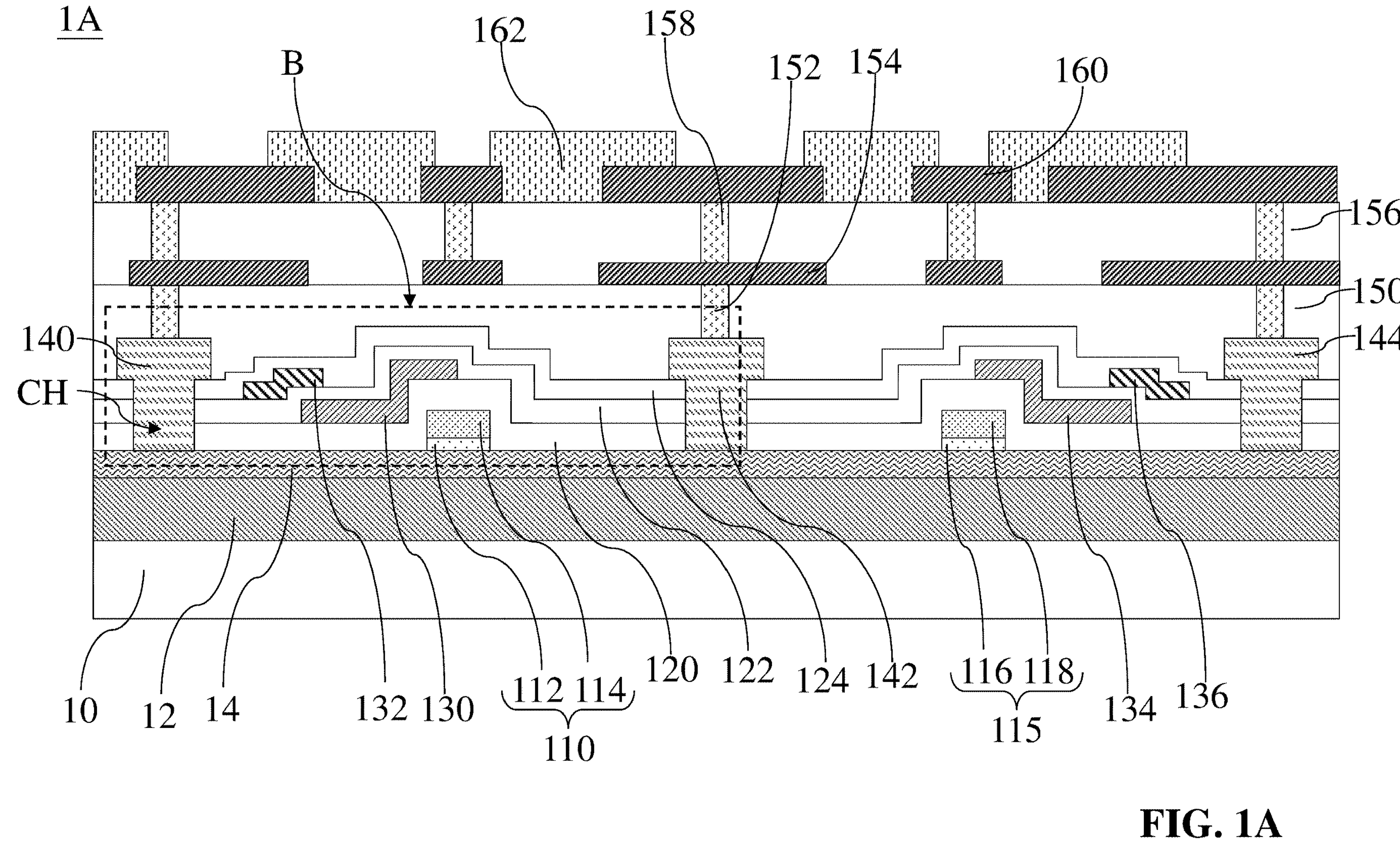
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1A is a vertical cross-sectional view of a semiconductor device 1A according to some embodiments of the present disclosure. The semiconductor device 1A includes a substrate 10, nitride-based semiconductor layers 12 and 14, gate structures 110 and 115, dielectric layers 120, 122, and 124, field plates 130, 132, 134, and 136, electrodes 140, 142, and 144, passivation layers 150 and 156, conductive vias 152 and 158, patterned circuit layers 154 and 160, and a protection layer 162.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof. In some embodiments, the material of the substrate 10 can include a silicon substrate with a <111> orientation.

The nitride-based semiconductor layer 12 is disposed on/over/above the substrate 10. The nitride-based semiconductor layer 14 is disposed on/over/above the nitride-based semiconductor layer 12. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y \leq 1$, $Al_yGa_{(1-y)}N$ where $y \leq 1$.

The exemplary materials of the nitride-based semiconductor layers 12 and 14 are selected such that the nitride-based semiconductor layer 12 has a bandgap (i.e., forbidden band width) greater than a bandgap of the nitride-based semiconductor layer 14, which causes electron affinities thereof different from each other and forms a heterojunction therebetween. For example, when the nitride-based semiconductor layer 12 is an undoped GaN layer having a bandgap of approximately 3.4 eV, the nitride-based semiconductor layer 14 can be selected as an AlGaN layer having bandgap of approximately 4.0 eV. As such, the nitride-based semiconductor layers 12 and 14 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

In some embodiments, the semiconductor device 1A may further include a buffer layer, a nucleation layer, or a combination thereof (not illustrated). The buffer layer can be disposed between the substrate 10 and the nitride-based semiconductor layer 12. The buffer layer can be configured to reduce lattice and thermal mismatches between the substrate and the nitride-based semiconductor layer 12, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlN, AlGaN, InAlGaN, or combinations thereof. The nucleation layer may be formed between the substrate 10 and the buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The gate structures 110 and 115 are disposed on/over/above the nitride-based semiconductor layer 14. The gate structures 110 and 115 are located at different positions of a top surface of the nitride-based semiconductor layer 14. The gate structure 110 includes a doped nitride-based semiconductor layer 112 and a gate electrode 114. The doped nitride-based semiconductor layer 112 is disposed on/over/above the nitride-based semiconductor layer 14. The doped nitride-based semiconductor layer 112 is disposed/sandwiched between the nitride-based semiconductor layer 14 and the gate electrode 114. The gate electrode 114 is disposed on/over/above and in contact with the doped nitride-based semiconductor layer 112. A width of the doped nitride-based semiconductor layer 112 is substantially the same as a width of the gate electrode 114.

In some embodiments, a width of the doped nitride-based semiconductor layer 112 can be greater than that of the gate electrode 114. The profiles of the doped nitride-based semiconductor layer 112 and the gate electrode 114 are the same. For example, both the doped nitride-based semiconductor layer 112 and the gate electrode 114 have rectangular profiles. In other embodiments, the profiles of the doped nitride-based semiconductor layer 112 and the gate electrode 114 can be different from each other. For example, the profile of the doped nitride-based semiconductor layer 112 can be a trapezoid profile in cross-section, and the profile of the gate electrode 114 can be a rectangular profile in cross-section. The gate structure 115 includes a doped nitride-based semiconductor layer 116 and a gate electrode 118. The configuration of the gate structure 110 can be applied to that of the gate structure 115.

In the exemplary illustration of FIG. 1A, the semiconductor device 1A is an enhancement mode device, which is in a normally-off state when the gate electrodes 114 and 118 are at approximately zero bias. Specifically, the doped nitride-based semiconductor layers 112 and 116 may create at least one p-n junction with the nitride-based semiconductor layer 106 to deplete the 2DEG region, such that zones of the 2DEG region corresponding to positions below the corresponding the gate electrodes 114 and 118 have different characteristics (e.g., different electron concentrations) than the remaining of the 2DEG region and thus is blocked. Due to this mechanism, the semiconductor device 1A has a normally-off characteristic. In other words, when no voltage is applied to the gate electrodes 114 and 118 or a voltage applied to the gate electrodes 114 and 118 is less than a threshold voltage (i.e., a minimum voltage required to form an inversion layer below the gate electrode 114 or 118), the zones of the 2DEG region below the gate electrodes 114 and 118 are kept blocked, and thus no current flows therethrough.

In some embodiments, the doped nitride-based semiconductor layers 112 and 116 can be omitted, such that the semiconductor device 1A is a depletion-mode device, which means the semiconductor device 1A in a normally-on state at zero gate-source voltage.

The doped nitride-based semiconductor layers 112 and 114 can be p-type doped III-V semiconductor layers. The exemplary materials of the doped nitride-based semiconductor layer 112 and 114 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 12 includes undoped GaN and the nitride-based semiconductor layer 14 includes AlGaN, and the doped nitride-based semiconductor layers 112 and 116 are p-type GaN layers which can bend the underlying band structure upwards and deplete the corresponding zones of the 2DEG region, so as to place the semiconductor device 1A into an off-state condition.

The exemplary materials of the gate electrodes 114 and 118 may include metals or metal compounds. The gate electrodes 114 and 118 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The dielectric layer 120 can be disposed on/over/above the nitride-based semiconductor layer 14 and the gate structure 110 and 115. The dielectric layer 120 can be conformal with the gate structure 110 and 115, so as to form protruding portions above the nitride-based semiconductor layer 14. The dielectric layer 122 can be disposed on/over/above the dielectric layer 120. The dielectric layer 124 can be disposed on/over/above the dielectric layer 122. The dielectric layers 120, 122, and 124 collectively include contact holes CH. Each of the protruding portions of the dielectric layer 120 can cover the corresponding one of the gate structures 110 and 115. The material of the dielectric layers 120, 122 and 124 can include, for example but is not limited to, dielectric materials. For example, the dielectric layers 120, 122 and 124 can include $SiN_x$ (e.g., $Si_3N_4$), $SiO_x$, $Si_3N_4$, SiON, SiC, SiBN, SiCBN, oxides, nitrides, oxides, nitrides, plasma-enhanced oxide (PEOX), tetraethoxysilane normal abbreviation (TEOS), or combinations thereof.

In some embodiments, the electrode 140 can serve as a source electrode. In some embodiments, the electrode 140 can serve as a drain electrode. In some embodiments, the electrode 142 can serve as a source electrode. In some embodiments, the electrode 142 can serve as a drain electrode. In some embodiments, the electrode 144 can serve as a source electrode. In some embodiments, the electrode 144 can serve as a drain electrode. The role of the electrodes 140, 142 and 144 depends on the device design.

The electrodes 140, 142, and 144 are disposed on/over/above the nitride-based semiconductor layer 14. The electrode 142 is located between the electrodes 140 and 144. The electrodes 140, 142, and 144 are in contact with the nitride-based semiconductor layer 14. The electrodes 140, 142, and 144 can extend through the contact holes CH of the dielectric layers 120, 122, and 124 to make contact with the nitride-based semiconductor layer 14. Each of the electrodes 140, 142, and 144 can penetrate the dielectric layers 120, 122, and 124 through the contact holes CH to make a contact with the nitride-based semiconductor layer 14.

The gate structures 110 and 115 are located between the electrodes 140 and 144. The gate structure 110 and the gate electrode 114 thereof is located between the electrodes 140 and 142. The electrode 142 is closer to the gate electrode 114 than the electrode 140. The gate structure 115 and the gate electrode 118 thereof is located between the electrodes 142 and 144. The electrode 142 is closer to the gate electrode 118 than the electrode 144.

In some embodiments, other configurations may be used, particularly when plural source, drain, or gate electrodes are employed in the device. In the exemplary illustration of FIG. 1A, a distance from the gate electrode 114 to the electrode 140 is greater than a distance from the gate electrode 114 to the electrode 142. A distance from the gate electrode 118 to the electrode 144 is greater than a distance from the gate electrode 118 to the electrode 142. The gate electrodes 114 and 118 can be arranged as being symmetrical about the electrode 142. In some embodiments, the gate electrodes 114 and 118 can be arranged as being asymmetrical about the electrode 142. The arrangement depends on different electrical property requirements.

In some embodiments, the electrodes 140, 142, and 144 can include, for example but are not limited to, metals, alloys, doped semiconductor materials (such as doped crystalline silicon), compounds such as silicides and nitrides, other conductor materials, or combinations thereof. The exemplary materials of the electrodes 140, 142, and 144 can include, for example but are not limited to, Ti, AlSi, TiN, or combinations thereof. The electrodes 140, 142, and 144 may be a single layer, or plural layers of the same or different composition. In some embodiments, the electrodes 140, 142, and 144 form ohmic contacts with the nitride-based semiconductor layer 106. The ohmic contacts can be achieved by applying Ti, Al, or other suitable materials to the electrodes 140, 142, and 144. In some embodiments, each of the electrodes 140, 142, and 144 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof.

The exemplary materials of the conductive filling can include, for example but are not limited to, AlSi, AlCu, or combinations thereof.

The gate electrodes 114 and 118, and the electrodes 140, 142, and 144, can collectively act as one or more nitride-based/GaN-based HEMTs with the single 2DEG region, which can be called a nitride-based/GaN-based semiconductor device.

The field plate 130 is the bottom-most/lowest field plate in the semiconductor device 1A. The field plate 130 is disposed on/over/above the dielectric layer 120 and the nitride-based semiconductor layer 14. The field plate 130 is in contact with the dielectric layer 120. The field plate 130 is conformal with the dielectric layer 120. The dielectric layer 122 covers the field plate 130 and the dielectric layer 120. The field plate 130 is disposed/sandwiched/embedded between the dielectric layers 120 and 122. The dielectric layer 122 is conformal with a profile constructed collectively by the field plate 130 and the dielectric layer 120.

The field plate 132 is the second lowest field plate in the semiconductor device 1A. The field plate 132 is disposed on/over/above the dielectric layer 122 and the nitride-based semiconductor layer 14. The field plate 132 is in contact with the dielectric layer 122. The field plate 132 is conformal with the dielectric layer 122. The dielectric layer 122 is located between the field plates 132 and 134 to vertically isolate the field plates 130 and 132. The dielectric layer 124 covers the field plate 132 and the dielectric layer 122. The field plate 132 is disposed/sandwiched/embedded between the dielectric layers 122 and 124. The dielectric layer 124 is conformal with a profile constructed collectively by the field plate 132 and the dielectric layer 124.

In order to avoid the breakdown phenomenon induced by a strong peak electric field near the gate edge, one approach to lower the peak of the electric field is to utilize multiple field plates to split the electric field into more peaks so as to achieve a more uniform electric field distribution. The field plates 130 and 132 can collectively change/modify an electric field distribution in the semiconductor device 1A and affect breakdown voltage thereof.

Figure 1B:
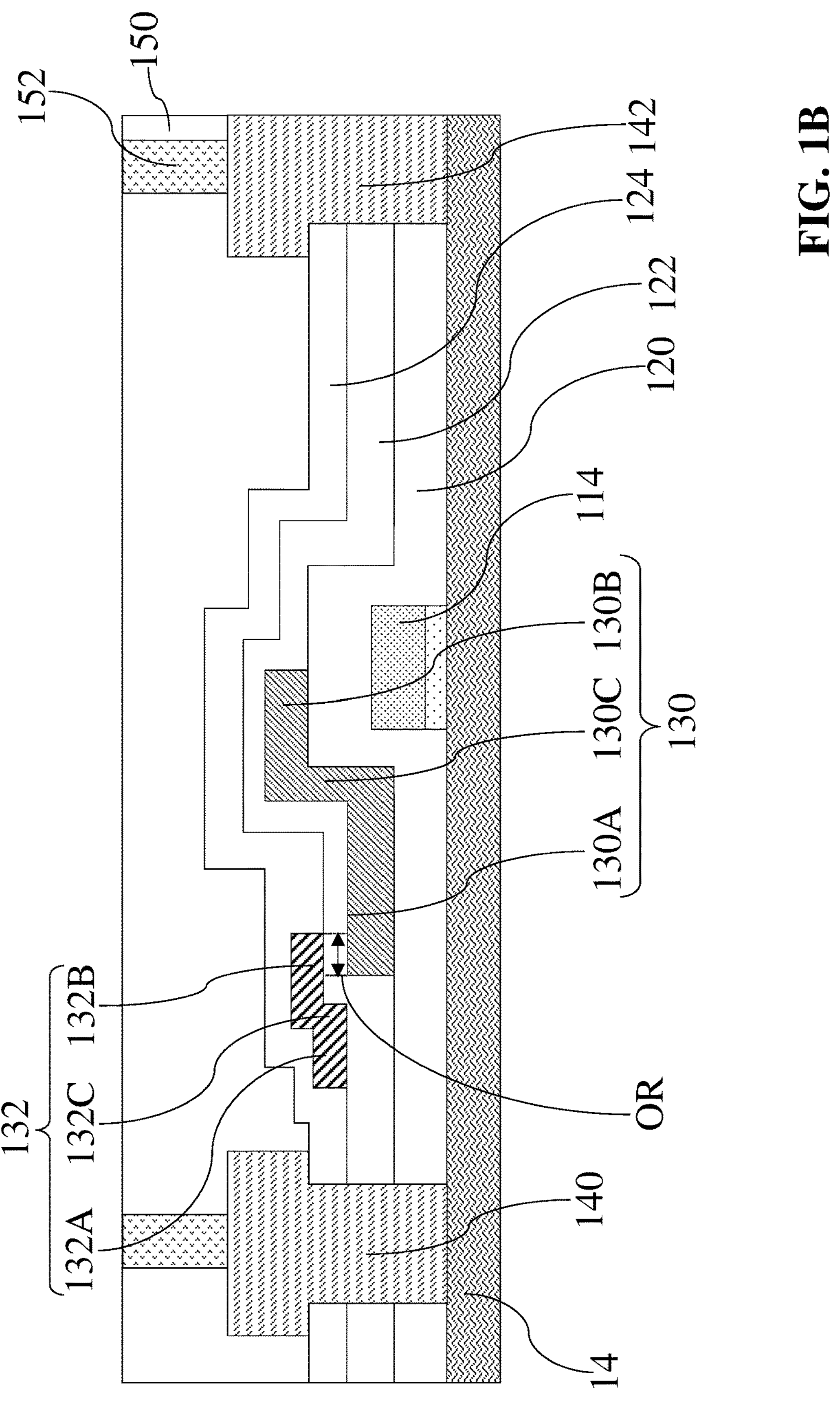
FIG. 1B is an enlarged vertical cross-sectional view of a region B in FIG. 1A.

FIG. 1B is an enlarged vertical cross-sectional view of a region B in the FIG. 1A. Although the following description is made with respect to the field plates 130 and 132, it can be applied to the field plates 134 and 136, respectively.

The field plate 130 extends from a region between the electrode 140 and the gate electrode 114 to a region directly over the gate electrode 114. Accordingly, the field plate 130 can vertically overlap with at least a portion of the gate electrode 114. There is another portion of the gate electrode 114 free from coverage of the field plate 130. Therefore, the overlapping width between the field plate 130 and the gate electrode 114 is less than a width of the gate electrode 114, which is advantageous to reduction of parasitic capacitance therebetween.

The field plate 130 includes three portions 130A, 130B, and 130C. The portion 130A is at the position/region between the electrode 140 and the gate electrode 114 and in a position lower than a top surface of the gate electrode 114. The portion 130B is at the position/region directly over the gate electrode 114 and in a position higher than the gate electrode 114. The portion 130B partially and vertically overlaps with the gate electrode 114. The portions 130A and 130B can be referred to as end portions of the field plate 130. The portion 130C is located between the portions 130A and 130B, so as to connect the portions 130A and 130B. The portion 130C extends upward to get higher than the top surface of the gate electrode 114.

The field plate 132 extends from a region between the electrode 140 and the gate electrode 114 to a region directly over the field plate 130. The field plate 132 is horizontally/laterally spaced away from the gate electrode 114; therefore, the field plate 132 does not vertically overlap with the gate electrode 114. The field plate 132 is horizontally/laterally spaced away from the portions 130B and 130C of the field plate 130. The field plate 132 has a width greater than an overlapping width between the field plates 130 and 132. The height of the field plate 132 with respect to the nitride-based semiconductor layer 14 is greater than the height of the portion 130A of the field plate 130. The height of the field plate 132 with respect to the nitride-based semiconductor layer 14 is less than the height of the 130B of the field plate 130. Accordingly, an entirety of the field plate 132 is located between the electrode 140 and the field plate 130. Herein, the phrase "an entirety of the field plate 132 located between the electrode 140 and the field plate 130" means that the electrode 140 and the field plate 130 can define a space therebetween having bottom and upper boundaries coinciding with bottom-most and top-most surfaces of the field plate 130, respectively, and the entirety of the field plate 132 is inside the space. No portion of the field plate 132 is in a position higher than the portion 130B of the field plate 130.

The field plate 132 includes three portions 132A, 132B, and 132C. The portion 132A is at the position/region between the electrode 140 and the portion 130A. The portion 132B is at the position/region directly over the portion 130A and in a position higher than the portion 130A. The portion 132B can vertically overlap with the portion 130A rather than vertically overlapping with the gate electrode 114. The portions 132A and 132B can be referred to as end portions of the field plate 132. The portion 132C is located between the portions 132A and 132B, so as to connect the portions 132A and 132B. The portion 132C extends upward so as to connect the portions 132A and 132B.

It should be noted that the geometry of the field plates 130 and 132 can determine the location of the localized peak electric field. In general, the electric field lines concentrate in a region adjacent to the end portion of the field plate, and the peak electric field occurs in the such adjacent region. For example, the localized peak electric field caused by the portion 132B would occur in the overlapping region OR. Since the portion 132B vertically overlaps with the portion 130A, the portion 130A can block the localized peak electric field in the overlapping region OR, so as to avoid negative impacts on the carrier motions in the nitride-based semiconductor layer 12 (e.g., channel layer).

As compared with a single field plate having a long dimension, although the single field plate may be able to modulate a desired wide range of an electric field, the field plate having the long dimension will raise a peeling issue due to stress accumulation. The semiconductor device 1A including field plates 130 and 132 can avoid the stress accumulation and can still modulate a desired big range of an electric field. Although parasitic capacitance may be generated between the field plates 130 and 132, as the overlapping width between the field plates 130 and 132 is designed as been small, the parasitic capacitance therebetween will not greatly raise. Moreover, the entirety of the field plate 132 is located between the electrode 140 and the field plate 130 and is not at a position higher than the field plate 130, it is advantageous to avoid increase in the overall thickness of the semiconductor device 1A.

Furthermore, as the field plate 130 is the bottom-most/lowest field plate in the semiconductor device 1A and thus is closer to the nitride-based semiconductor layer 12 (e.g., channel layer) than the field plate 132, the field plate 130 may have high weight of the affection to the carrier motions in the nitride-based semiconductor layer 12. In order to alleviate the potential affection to the carrier motions, the field plate 130 can be designed to have a thickness different than a thickness of the field plate 132. For example, the field plate 130 can be designed to have a thicker thickness than the field plate 132. One of the reasons to support to make the field plate 130 thicker is that the overlapping width between the field plates 130 and 132 is designed as been small so parasitic capacitance therebetween will not greatly raise as the field plate 130 becomes thicker. This is also an advantage for using two individual layers as field plates because the difference between the thicknesses of them can serve as a factor for tuning the performance of the semiconductor device 1A.

The exemplary material of the field plates 130, 132, 134, and 136 can include, for example but are not limited to, conductive materials, such as Ti, Ta, TiN, TaN, or combinations thereof. In some embodiments, other conductive materials such as Al, Cu, doped Si, and alloys including these materials may also be used.

Referring to FIG. 1A again, the passivation layer 150 can be disposed on/over/above electrodes 140, 142, 144, and the dielectric layer 124. The material of the passivation layer 150 can include, for example but is not limited to, dielectric materials. The passivation layer 150 can serve as a planarization layer which has a level top surface to support other layers/elements. In some embodiments, the passivation layer 150 can be formed as being thicker, and a planarization process, such as a chemical mechanical polish (CMP) process, is performed on the passivation layer 150 to remove the excess portions, thereby forming a level top surface. The exemplary materials of the passivation layer 150 can be identical to or similar to that of the dielectric layers 120, 122, and 124.

The conductive vias 152 are disposed within the passivation layer 150. The conductive vias 152 penetrate the passivation layer 150. The conductive vias 152 extend longitudinally to electrically couple with the electrodes 140, 142, and 144, respectively. The upper surfaces of the conductive vias 152 are free from coverage of the passivation layer 150. The exemplary materials of the conductive vias 152 can include, for example but are not limited to, conductive materials, such as metals or alloys.

The patterned conductive layer 154 is disposed on the passivation layer 150 and the conductive vias 152. The patterned conductive layer 154 is in contact with the conductive vias 152. The patterned conductive layer 154 may have metal lines, pads, traces, or combinations thereof, such that the patterned conductive layer 154 can form at least one circuit. The exemplary materials of the patterned conductive layer 154 can include, for example but are not limited to, conductive materials. The patterned conductive layer 154 may include a single film or multilayered film having Ag, Al, Cu, Mo, Ni, Ti, alloys thereof, oxides thereof, nitrides thereof, or combinations thereof.

For a device with a multi-field-plate configuration, parasitic capacitance among the field plates and metal lines is a parasitic capacitance issue. For example, there may be two or more field plates present above a gate electrode and beneath a metal line, and such the configuration will introduce/generate additional parasitic capacitance among the gate electrode, the metal line, and the two field plates. By positioning an entirety of the field plate 132 between the electrode 140 and the field plate 130, no conductive layer is located between the field plate 130 and a top surface of the passivation layer 150, so it can simplify the parasitic capacitance issue, which can reduce the probability of generating unwanted parasitic capacitance.

The passivation layer 156 is disposed on/over/above the passivation layer 150 and the patterned conductive layer 154. The passivation layer 156 covers the passivation layer 150 and the patterned conductive layer 154. The exemplary materials of the passivation layer 156 can be identical to or similar with that of the passivation layer 150.

The conductive vias 158 are disposed within the passivation layer 156. The conductive vias 158 penetrate the passivation layer 156. The conductive vias 158 extend longitudinally to electrically couple with the patterned conductive layers 154 and 160. The upper surfaces of the conductive vias 158 are free from coverage of the passivation layer 156. The exemplary materials of the conductive vias 158 can be identical to or similar with that of the conductive vias 152.

The patterned conductive layer 160 is disposed on/over/above the passivation layer 156 and the conductive vias 158. The patterned conductive layer 160 is in contact with the conductive vias 158. The patterned conductive layer 158 may have metal lines, pads, traces, or combinations thereof, such that the patterned conductive layer 160 can form at least one circuit. The exemplary materials of the patterned conductive layer 160 can be identical to or similar with that of the patterned conductive layer 154.

The protection layer 162 is disposed above the passivation layer 156 and the patterned conductive layer 160. The protection layer 162 covers the passivation layer 156 and the patterned conductive layer 160. The protection layer 162 can prevent the patterned conductive layer 160 from oxidizing. Some portions of the patterned conductive layer 160 can be exposed through openings in the protection layer 162, which are configured to electrically connect to external elements (e.g., an external circuit).

Figure 1C:
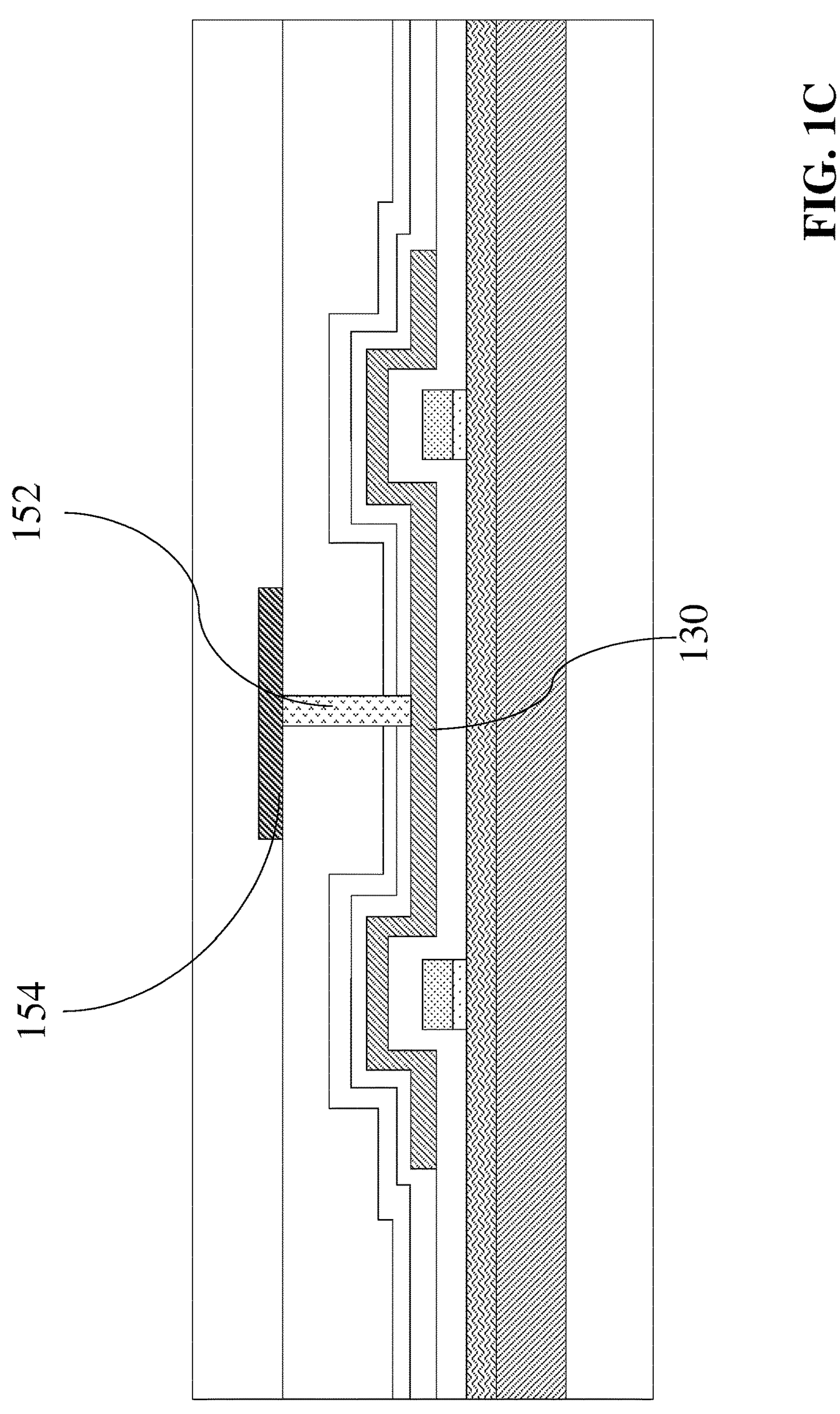
FIGS. 1C and 1D are different vertical cross-sectional views of the semiconductor device in FIG. 1A.
Figure 1D:
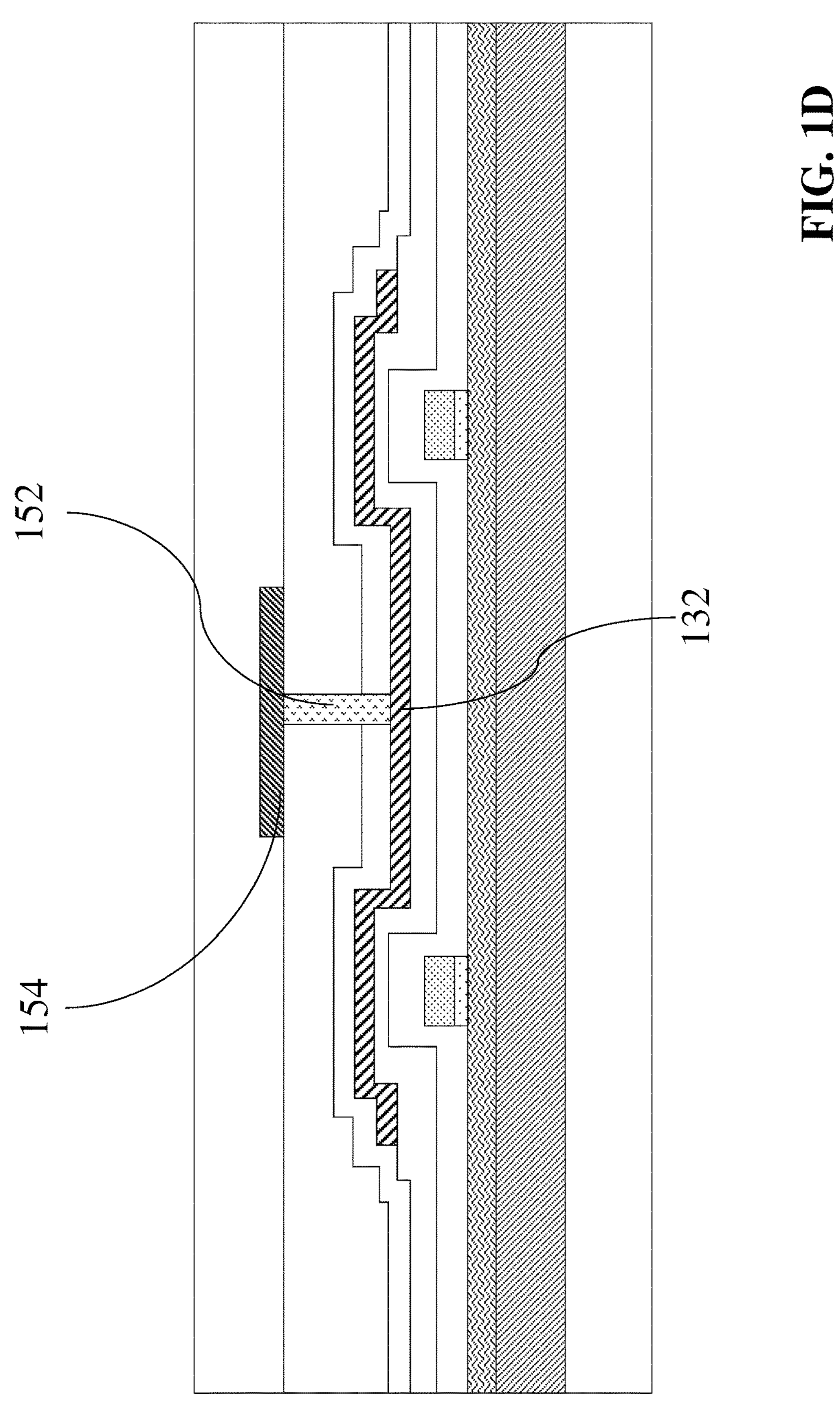

The field plates 130 and 132 can be electrically connected to the same electric potential source. For example, FIGS. 1C and 1D are different vertical cross-sectional views of the semiconductor device 1A in FIG. 1A. Referring to FIGS. 1C and 1D, the field plates 130 and 132 can be conducted to the same electric potential source through the conductive vias 152 and the patterned conductive layer 154. For example, the field plates 130 and 132 can be conducted to the same conductive pad of the patterned conductive layer 154. In some embodiments, the field plates 130 and 132 can be conducted to the electric potential source which the electrode 142 conducted to. As the electrode 142 serves as a source electrode, the field plates 130 and 132 can serve as source-connected field plates, which is advantageous to improve power capability and reduce gate-to-drain feedback capacitance.

Different stages of a method for manufacturing the semiconductor device 1A are shown in FIG. 2A, FIG. 2B, FIG. 2C, FIG. 2D, FIG. 2E, FIG. 2F, FIG. 2G and FIG. 2H, as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figures 2A, 2B, 2C:
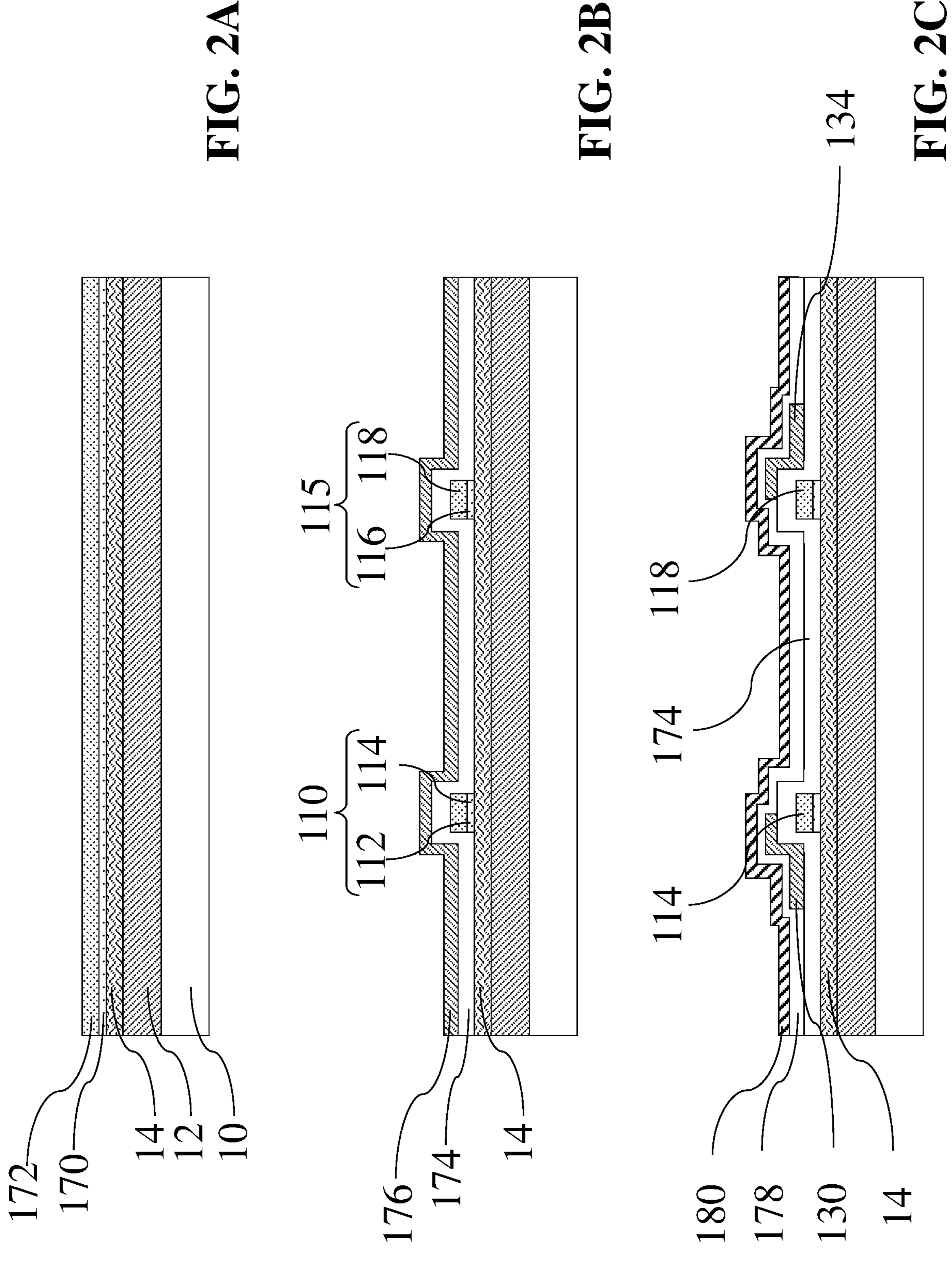
FIG. 2A, FIG. 2B, FIG. 2C, FIG. 2D, FIG. 2E, FIG. 2F, FIG. 2G and FIG. 2H show different stages of a method for manufacturing a nitride-based semiconductor device according to some embodiments of the present disclosure.

Referring to FIG. 2A, a nitride-based semiconductor layer 12 can be formed on/over/above the substrate 10 by using the above-mentioned deposition techniques. A nitride-based semiconductor layer 14 can be formed on/over/above the nitride-based semiconductor layer 12 by using the above-mentioned deposition techniques. A blanket doped nitride-based semiconductor layer 170 is formed on/over/above the nitride-based semiconductor layer 14. A blanket conductive layer 172 is formed on/over/above the blanket doped nitride-based semiconductor layer 170.

Referring to FIG. 2B, a patterning process is performed on the blanket doped nitride-based semiconductor layer 170 and the blanket conductive layer 172 to remove excess portions thereof, so as to form separated gate structures 110 and 115. The gate structure 110 includes a doped nitride-based semiconductor layer 112 and a gate electrode 114. The gate structure 115 includes a doped nitride-based semiconductor layer 116 and a gate electrode 118. The patterning process can be performed by photolithography, exposure and development, etching, other suitable processes, or combinations thereof. Then, an intermediate dielectric layer 174 and a blanket field plate/conductive layer 176 are formed on/over/above the nitride-based semiconductor layer 14 in sequence to cover the gate structures 110 and 115.

Referring to FIG. 2C, a patterning process is performed on the blanket field plate 176 to remove excess portions thereof, so as to form the field plates 130 and 134. Each of the field plates 130 and 134 is formed over the nitride-based semiconductor layer 14 and extends to a region directly over the corresponded gate electrode 114 or 118. In some embodiments, the patterning process can be performed by a wet etching process. Some portions of the blanket field plate/conductive layer 176 are removed by the wet etching process, so as to form the field plates 130 and 134. As afore-mentioned, the wet etching process can provide a high selectivity, which means that the wet etching process is a selective etching process. Therefore, no over-etching would occur at the intermediate dielectric layer 174 and thus the thickness of the intermediate dielectric layer 174 can be kept the same or almost the same. Therefore, the element layers, which are going to be formed on/over/above the intermediate dielectric layer 174 can be positioned to comply with the device design, thereby avoiding degradation in the performance of the semiconductor device.

In some embodiments, the blanket field plate/conductive layer 176 is made of TiN and the intermediate dielectric layer 174 is made of $Si_3N_4$. The etchant applied to the wet etching process can have a higher etching rate with respect to the TiN than that of the $Si_3N_4$. Then, an intermediate dielectric layer 178 and a blanket field plate/conductive layer 180 are formed on/over/above the field plates 130 and 132 in sequence. The position of the blanket field plate/conductive layer 180 is higher than the field plates 130 and 134.

Figures 2D, 2E, 2F:
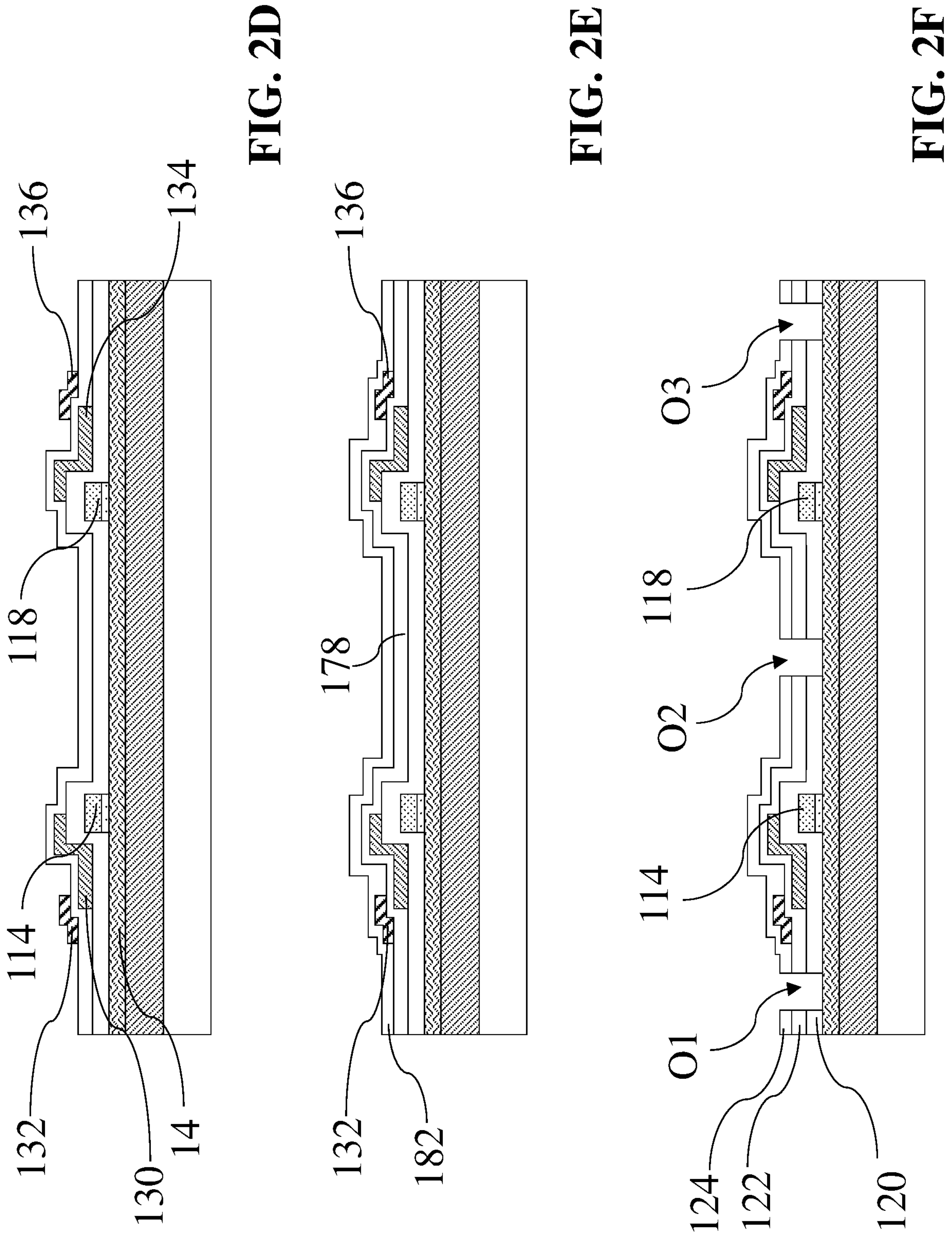

Referring to FIG. 2D, a patterning process is performed on the blanket field plate/conductive layer 180 to remove excess portions thereof, so as to form the field plates 132 and 136 in positions higher than the field plates 130 and 134. The field plate 132 is formed on/over/above the nitride-based semiconductor layer 14 and extends to a region directly over the corresponded field plate 130, such that the field plate 130 is located between the gate electrode 114 and the field plate 132. The field plate 136 is formed on/over/above the nitride-based semiconductor layer 14 and extends to a region directly over the corresponded field plate 134, such that the field plate 134 is located between the gate electrode 118 and the field plate 136. Each of the field plates 132 and 136 is formed to be horizontally spaced away from the corresponded gate electrode 114 or 118.

Referring to FIG. 2E, an intermediate dielectric layer 182 is formed on/over/above the field plates 132 and 136 and the intermediate dielectric layer 178.

Referring to FIG. 2F, a patterning process is performed on the intermediate dielectric layers 174, 178 and 182 to form a plurality of openings O1 to O3, such that the dielectric layers 120, 122 and 124 are formed. The gate electrode 114 is located between the openings O1 and O2. The gate electrode 118 is located between the openings O2 and O3. The locations of the openings O1 to O3 can be determined by the patterns in the photomask applied in the patterned process.

Figures 2G, 2H:
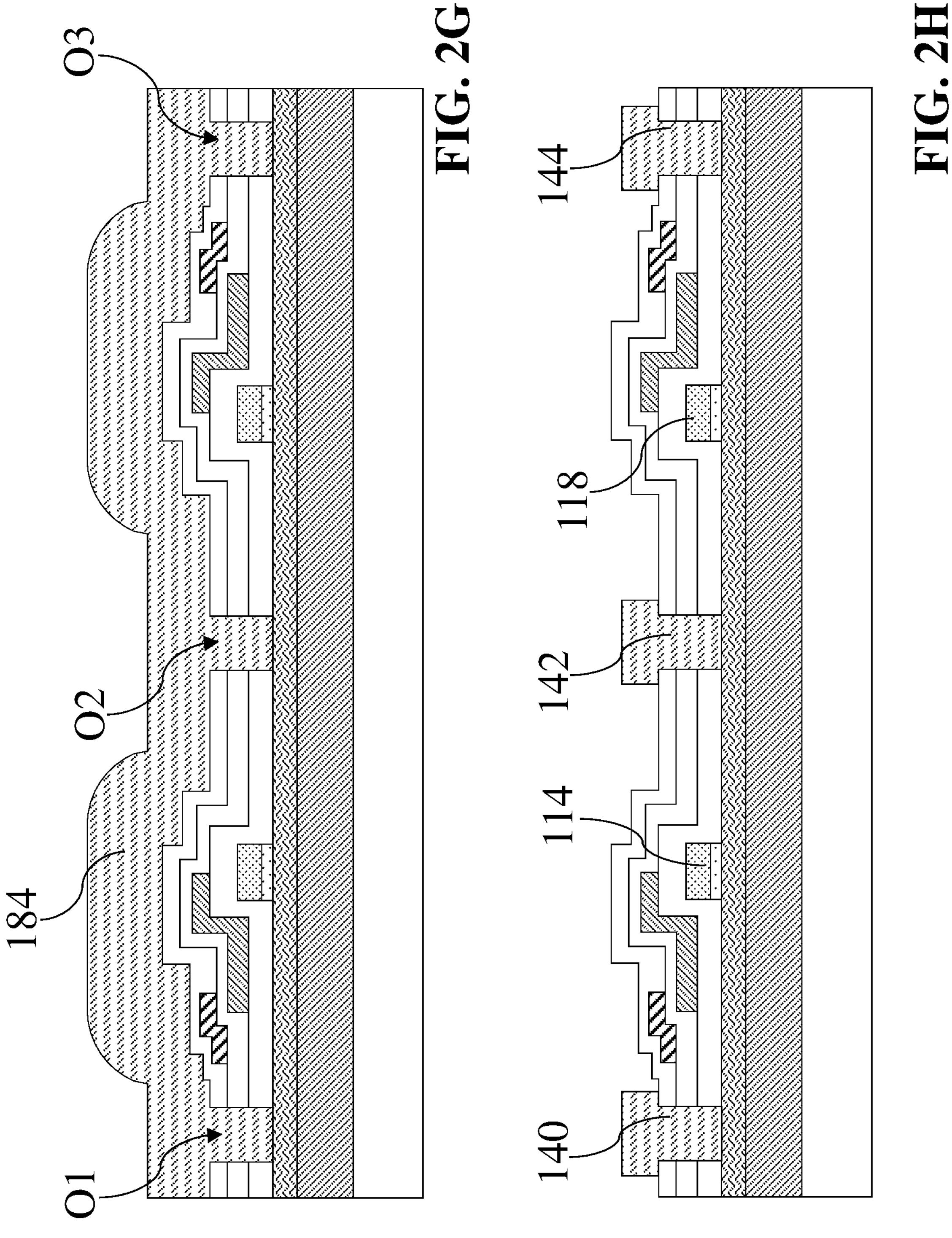

Referring to FIG. 2G, a conductive layer 184 is formed on/over/above the resultant structure in FIG. 2F, such that the openings O1 to O3 are filled with portions of the conductive layer 184.

Referring to FIG. 2H, a pattern process is performed on the conductive layer 184 to remove excess portions thereof, so as to form electrodes 140, 142 and 144. The gate electrode 114 is located between the electrodes 140 and 142. The gate electrode 118 is located between the electrodes 142 and 144. Thereafter, passivation layers 150 and 156, conductive vias 152 and 158, patterned circuit layers 154 and 160, and protection layer 162 can be formed, obtaining the configuration of the semiconductor device 1A as shown in FIG. 1A.

Figure 3:
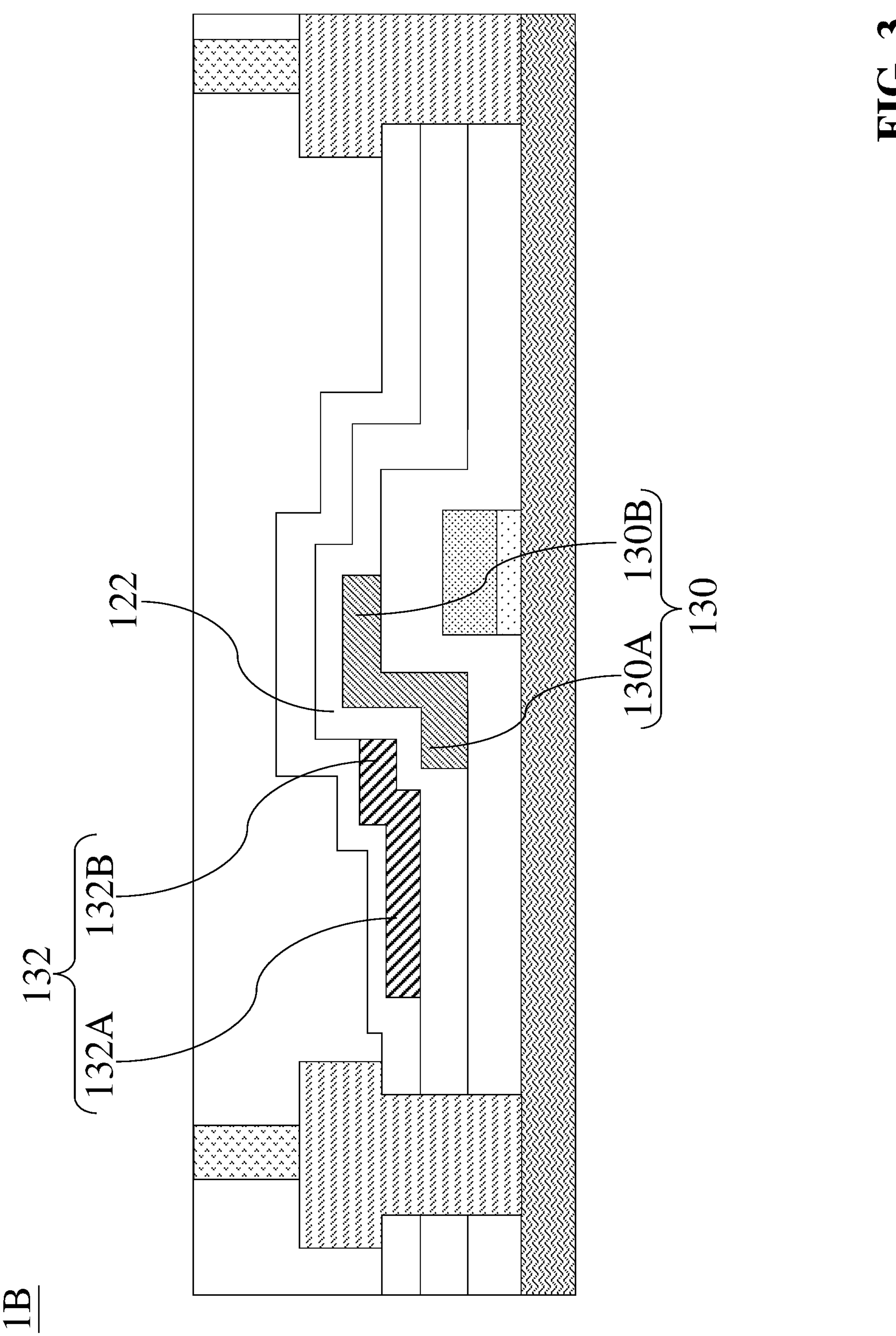
FIG. 3 is an enlarged vertical cross-sectional view of a semiconductor device according to some embodiments of the present disclosure.

FIG. 3 is an enlarged vertical cross-sectional view of a semiconductor device 1B according to some embodiments of the present disclosure. In the present embodiment, as shown in the exemplary illustration of FIG. 3, the horizontal extending length of the portion 130B is greater than that of the portion 130A. The horizontal extending length of the portion 132B is less than that of the portion 132A. A sidewall of the portion 132B (e.g., the right sidewall in FIG. 3) can abut against the dielectric layer 122. In this regard, the field plate 132 is obtained by performing a patterning process. As considered of process variation of the patterning process, the sidewall may be formed with an unexpected profile, which will affect the yield rate. By forming the field plate 132 with the sidewall abutting against the dielectric layer 122, the influence of the sidewall profile to the yield rate can be reduced.

Figure 4:
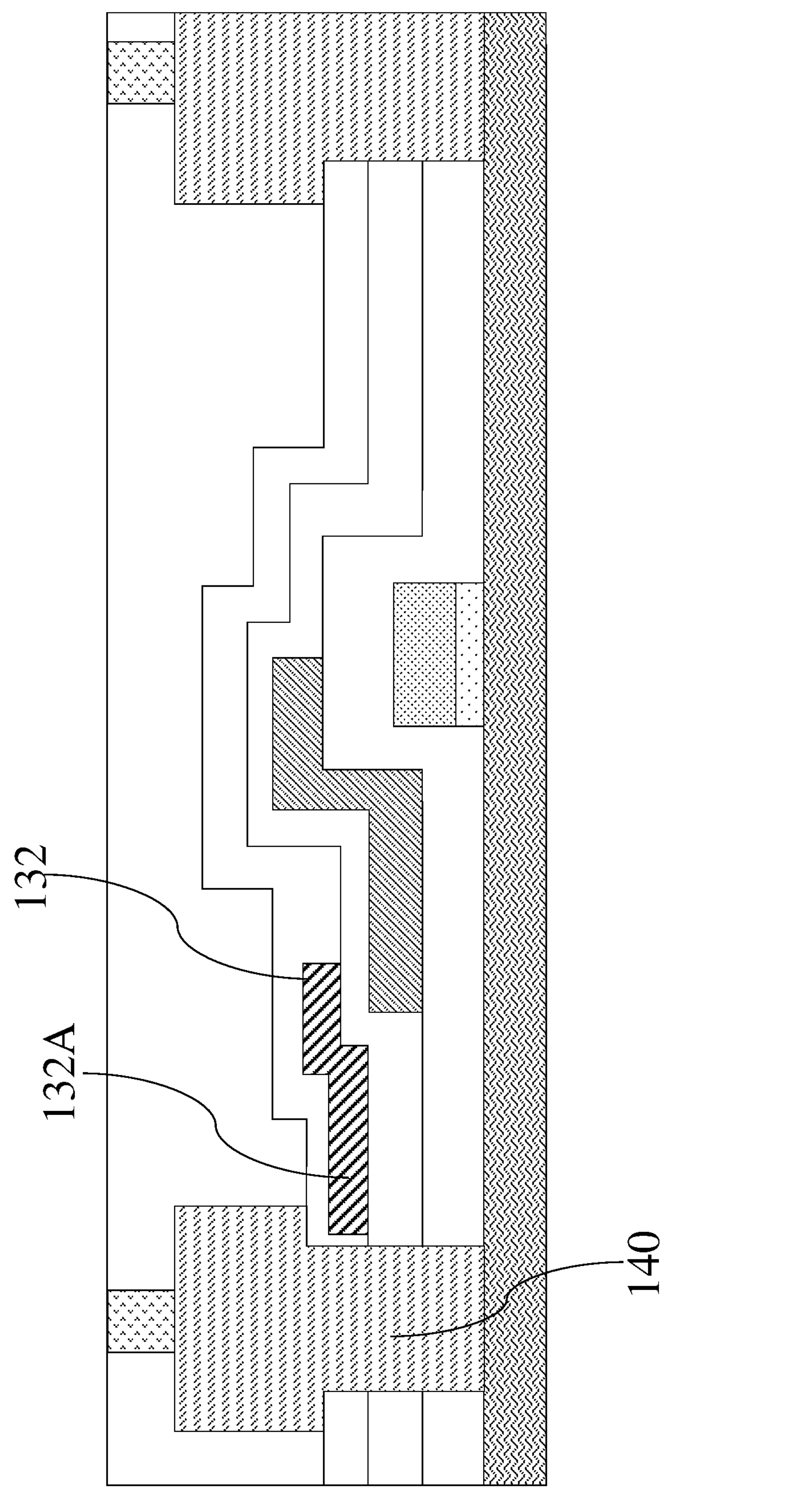
FIG. 4 is an enlarged vertical cross-sectional view of a semiconductor device according to some embodiments of the present disclosure.

FIG. 4 is an enlarged vertical cross-sectional view of a semiconductor device 1C according to some embodiments of the present disclosure. In the present embodiment, as shown in the exemplary illustration of FIG. 4, the portion 132A extends to a position/region directly under the electrode 140, so at least one part of the portion 132A can vertically overlap with the electrode 140. Such the configuration is made as the modulation to the electric field is concerned.

In the semiconductor devices 1A, 1B, and 1C, since the electric field lines will concentrate at the region adjacent to the end portion of the field plate during the device operation, the locations where the peak electric field occurs can be determined/tuned by changing/altering the extending lengths of the portions 130A, 130B, 132A, and 132C, so as to achieve a better electric field distribution.

Based on the above description, in the present embodiments of the disclosure, the semiconductor device adopts a multi-field-plate structure design so as to achieve a desirable electric field distribution and a better performance. At least a portion of the gate electrode is free from the coverage of the bottom-most field plate, which can confine the overlapping area between the bottom-most field plate and the gate electrode. Therefore, the parasitic capacitance between the bottom-most field plate and the gate electrode can be confined. The second lowest field plate extends to a position/region directly above the bottom-most field plate and it is horizontally/laterally spaced away from the gate electrode. As such, the second lowest field plate can partially and vertically overlap with the bottom-most field plate rather than vertically overlapping with the gate electrode. Such a configuration can reduce the parasitic capacitance between the second lowest field plate and the gate electrode, thereby enhancing the electrical properties of the semiconductor device.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:

a first nitride-based semiconductor layer disposed above a substrate;

a second nitride-based semiconductor layer disposed on the first nitride-based semiconductor layer and having a bandgap greater than a bandgap of the first nitride-based semiconductor layer;

a first electrode and a second electrode disposed above the second nitride-based semiconductor layer;

a first gate electrode disposed above the second nitride-based semiconductor layer and between the first and second electrodes;

a first dielectric layer disposed on the second nitride-based semiconductor layer and the first gate electrode;

a first field plate disposed over the first dielectric layer and comprising: a first portion located in a region between the first electrode and the first gate electrode and not vertically overlapping with the first gate electrode; a second portion partially and vertically overlapping with the first gate electrode; and a third portion connecting the first portion to the second portion;

a second dielectric layer disposed on the first dielectric layer and the first field plate; and a second field plate disposed over the second dielectric layer and comprising: a fourth portion located in a region between the first electrode and the first field plate and not vertically overlapping with the first field plate; a fifth portion partially and vertically overlapping with the first portion of the first field plate; and a sixth portion connecting the fourth portion and the fifth portion, wherein the second field plate does not vertically overlap with the first gate electrode, and a height of a top-most surface of the second field plate with respect to the second nitride-based semiconductor layer is less than a height of a top-most surface of the first field plate with respect to the second nitride-based semiconductor layer.

2. The semiconductor device of claim 1, wherein an entirety of the second field plate is located between the first electrode and the first field plate.

3. The semiconductor device of claim 1, wherein the first portion is located in a position lower than the first gate electrode; and the second portion is located in a position higher than the first gate electrode.

4. The semiconductor device of claim 1, wherein the second field plate is horizontally spaced away from the second portion of the first field plate.

5. The semiconductor device of claim 4, wherein the first portion has a first height with respect to the second nitride-based semiconductor layer, wherein the second portion has a second height with respect to the second nitride-based semiconductor layer, wherein the fifth portion of the second field plate has a third height with respect to the second nitride-based semiconductor layer, and the third height is greater than the first height and less than the second height.

6. The semiconductor device of claim 1, wherein the first field plate further comprises:

the third portion extends upward to get higher than the first gate electrode.

7. The semiconductor device of claim 6, wherein the second field plate is horizontally spaced away from the third portion of the first field plate.

8. The semiconductor device of claim 1, further comprising:

a third electrode disposed above the second nitride-based semiconductor layer, wherein the second electrode is located between the first and third electrodes; and a second gate electrode disposed above the second nitride-based semiconductor layer and located between the second and third electrodes.

9. The semiconductor device of claim 8, further comprising:

a third field plate disposed over the second nitride-based semiconductor layer and extending from a region between the third electrode and the second gate electrode to a region directly over the second gate electrode; and a fourth field plate disposed over the second nitride-based semiconductor layer and extending from a region between the third electrode and the third field plate to a region directly over the third field plate.

10. The semiconductor device of claim 8, wherein the second electrode is closer to the first gate electrode than the first electrode, and the second electrode is closer to the second gate electrode than the third electrode.

11. The semiconductor device of claim 1, wherein the first field plate has a thickness different than a thickness of the second field plate.

12. The semiconductor device of claim 1, wherein the first and second field plate are electrically connected to the same conductive layer.

13. The semiconductor device of claim 1, wherein the second field plate has a width greater than an overlapping width between the first and second field plates.

14. A method for manufacturing a semiconductor device, comprising:

forming a first nitride-based semiconductor layer over a substrate;

forming a second nitride-based semiconductor layer on the first nitride-based semiconductor layer;

forming a gate electrode over the second nitride-based semiconductor layer;

forming a first dielectric layer on the second nitride-based semiconductor layer and the gate electrode;

forming a first field plate over the first dielectric layer;

forming a second dielectric layer on the first dielectric layer and the first field plate;

forming a second field plate over the second dielectric layer; and forming a first electrode and a second electrode over the second nitride-based semiconductor layer, wherein the gate electrode is located between the first and second electrodes, wherein the first field plate comprises: a first portion located in a region between the first electrode and the gate electrode and not vertically overlapping with the gate electrode; a second portion partially and vertically overlapping with the gate electrode; and a third portion connecting the first portion to the second portion, wherein the second field plate comprises: a fourth portion located in a region between the first electrode and the first field plate and not vertically overlapping with the first field plate; a fifth portion partially and vertically overlapping with the first portion of the first field plate; and a sixth portion connecting the fourth portion and the fifth portion, and wherein the second field plate does not vertically overlap with the gate electrode, and a height of a top-most surface of the second field plate with respect to the second nitride-based semiconductor layer is less than a height of a top-most surface of the first field plate with respect to the second nitride-based semiconductor layer.

15. The method of claim 14, wherein forming the second field plate comprises:

patterning a conductive layer to form the second field plate horizontally spaced away from the gate electrode.

16. The method of claim 14, wherein forming the second field plate comprises:

patterning a conductive layer to form the second field plate in a position lower than a top surface of the first field plate.

17. The method of claim 14, further comprising:

electrically connecting the first and second field plates to the same conductive pad.

18. The method of claim 14, wherein the first electrode is closer to the gate electrode than the second electrode.

19. A semiconductor device, comprising:

a first nitride-based semiconductor layer disposed above a substrate;

a second nitride-based semiconductor layer disposed on the first nitride-based semiconductor layer and having a bandgap greater than a bandgap of the first nitride-based semiconductor layer;

a first electrode and a second electrode disposed above the second nitride-based semiconductor layer;

a first gate electrode disposed above the second nitride-based semiconductor layer and between the first and second electrodes;

a first field plate disposed over the second nitride-based semiconductor layer and extending from a region between the first electrode and the first gate electrode to a region directly over the first gate electrode;

a second field plate disposed over the second nitride-based semiconductor layer and extending from a region between the first electrode and the first field plate to a region directly over the first field plate, wherein the second field plate is horizontally spaced away from the first gate electrode;

a third electrode disposed above the second nitride-based semiconductor layer, wherein the second electrode is located between the first and third electrodes;

a second gate electrode disposed above the second nitride-based semiconductor layer and located between the second and third electrodes;

a third field plate disposed over the second nitride-based semiconductor layer and extending from a region between the third electrode and the second gate electrode to a region directly over the second gate electrode; and a fourth field plate disposed over the second nitride-based semiconductor layer and extending from a region between the third electrode and the third field plate to a region directly over the third field plate.

* * * * *